US008022496B2

(12) United States Patent
Coolbaugh et al.

(10) Patent No.: US 8,022,496 B2
(45) Date of Patent: Sep. 20, 2011

(54) SEMICONDUCTOR STRUCTURE AND METHOD OF MANUFACTURE

(75) Inventors: Douglas D. Coolbaugh, Highland, NY (US); Alvin J. Joseph, Williston, VT (US); Seong-dong Kim, Williston, VT (US); Louis D. Lanzerotti, Burlington, VT (US); Xuefeng Liu, South Burlington, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/873,696

(22) Filed: Oct. 17, 2007

(65) Prior Publication Data
US 2008/0099787 A1    May 1, 2008

Related U.S. Application Data

(63) Continuation of application No. 11/163,882, filed on Nov. 2, 2005, now Pat. No. 7,329,940.

(51) Int. Cl.
*H01L 29/47* (2006.01)
(52) U.S. Cl. ........ 257/474; 257/458; 257/479; 257/502; 257/542; 257/549; 257/560; 257/E21.537; 257/E29.034; 257/E29.184; 257/197
(58) Field of Classification Search .......... 257/474, 257/479, 502, 542, 549, 560–564, 567, E27.058, 257/E29.034–E29.035, E29.114, E29.181, 257/E29.184–E29.185, E29.199, E29.2, E21.537, 257/458, 197
See application file for complete search history.

(56) References Cited

U.S. PATENT DOCUMENTS

| 4,005,469 | A | | 1/1977 | Chang et al. | |
| 4,159,915 | A | | 7/1979 | Anantha et al. | |
| 4,228,448 | A | * | 10/1980 | Lalumia et al. | 257/474 |
| 4,644,383 | A | * | 2/1987 | Akcasu | 257/517 |
| 5,422,501 | A | | 6/1995 | Bayraktaroglu | |

(Continued)

FOREIGN PATENT DOCUMENTS

CN    1531102    9/2004

(Continued)

OTHER PUBLICATIONS

Office Action from U.S. Appl. No. 11/941,452, dated Feb. 6, 2009.

(Continued)

*Primary Examiner* — Bradley K Smith
*Assistant Examiner* — Mohammad T Karimy
(74) *Attorney, Agent, or Firm* — Anthony Canale; Roberts Mlotkowski Safran & Cole, P.C.

(57) ABSTRACT

A structure comprises a single wafer with a first subcollector formed in a first region having a first thickness and a second subcollector formed in a second region having a second thickness, different from the first thickness. A method is also contemplated which includes providing a substrate including a first layer and forming a first doped region in the first layer. The method further includes forming a second layer on the first layer and forming a second doped region in the second layer. The second doped region is formed at a different depth than the first doped region. The method also includes forming a first reachthrough in the first layer and forming a second reachthrough in second layer to link the first reachthrough to the surface.

25 Claims, 9 Drawing Sheets

U.S. PATENT DOCUMENTS

| | | | |
|---|---|---|---|
| 5,605,851 | A | 2/1997 | Palmieri et al. |
| 5,798,560 | A * | 8/1998 | Ohkawa et al. ............... 257/555 |
| 6,011,297 | A | 1/2000 | Rynne |
| 6,281,565 | B1 * | 8/2001 | Yoshitake ..................... 257/590 |
| 6,414,371 | B1 | 7/2002 | Freeman et al. |
| 6,489,660 | B1 | 12/2002 | Einthoven et al. |
| 6,656,815 | B2 | 12/2003 | Coolbaugh et al. |
| 6,891,251 | B2 * | 5/2005 | Coolbaugh et al. ........... 257/595 |
| 6,927,452 | B2 | 8/2005 | Shin et al. |
| 7,001,806 | B2 | 2/2006 | Tilke et al. |
| 7,180,157 | B2 | 2/2007 | Freeman et al. |
| 7,202,514 | B2 | 4/2007 | Ahmed et al. |
| 7,329,940 | B2 | 2/2008 | Coolbaugh et al. |
| 2001/0042867 | A1 | 11/2001 | Furuhata |
| 2002/0084506 | A1 | 7/2002 | Voldman et al. |
| 2003/0094673 | A1 | 5/2003 | Dunn et al. |
| 2004/0014271 | A1 * | 1/2004 | Cantell et al. ................ 438/205 |
| 2004/0036115 | A1 | 2/2004 | Disney |
| 2004/0227210 | A1 | 11/2004 | Tilke et al. |
| 2005/0207077 | A1 | 9/2005 | Xu et al. |

FOREIGN PATENT DOCUMENTS

DE  1817497  6/1980

OTHER PUBLICATIONS

Goins E.W., "Semiconductor structure with high and low voltage section", IBM technical disclosure bulletin, vol. 25, No. 6, pp. 3103-3104, Nov. 1982.

Notice of Allowance dated Jun. 9, 2009, in related U.S. Appl. No. 11/941,452.

Corrected Notice of Allowance dated Jun. 19, 2009, in related U.S. Appl. No. 11/941,452.

Supplemental Notice of Allowability dated Aug. 12, 2009, in related U.S. Appl. No. 11/941,452.

* cited by examiner

SEMICONDUCTOR STRUCTURE AND METHOD OF MANUFACTURE

CROSS REFERENCE TO RELATED APPLICATIONS

This application is a continuation of U.S. patent application Ser. No. 11/163,882, filed Nov. 2, 2005, now U.S. Pat. No. 7,329,940 the disclosure of which is expressly incorporated by reference herein in its entirety.

BACKGROUND OF INVENTION

1. Field of the Invention

The invention relates generally to a semiconductor structure and method of manufacturing and more particularly to an on-chip PIN diode working at millimeter wave range and a method of manufacturing the same using a dual epitaxial process.

2. Background Description

High frequency applications such as, millimeter wave devices (f30 GHz), require multifunction circuits with different types of devices for optimum operation. For example, in advanced microwave devices, transmitter circuits of communication and radar systems use heterojunction bipolar transistors (HBTs). But, in this same device, receiver circuits comprise III-V material based field effect transistors (FETs), such as high electron mobility transistors (HEMTs), to minimize the noise figure and therefore improve the receiver sensitivity. The performance of such multifunction circuit devices can be reduced if all of the subsystem functions can be accomplished with the use of a common device process technique to integrate all of the relevant advanced devices onto the same substrate.

In currently known manufacturing processes, high-speed three terminal devices and microwave diodes such as PIN diodes, etc. are fabricated by epitaxial growth techniques on high resistive or insulating substrates. In one conventional process, conventional on-chip PIN diodes are processed by sharing the NPN C-B structures. However, this poses problems with the overall performance of the device. For example, known processing using a single wafer technology cannot provided a thin film collector for a high performance NPN (bipolar) device and a thick film collector for high breakdown voltage devices.

By way of one specific example, it is known to implant an HBT subcollector region of a first conductivity in a substrate at a first surface. A PIN diode region of a first conductivity is then implanted in the substrate at the first surface and spaced from the HBT subcollector region. Next, an HBT base/PIN diode layer of a second conductivity is selectively grown on the i-layer over the HBT subcollector region and the PIN diode region. Then, an HBT emitter layer on the first conductivity is selectively grown over the HBT base/PIN diode layer. An isolation region is then made by polysilicon filled deep trench and shallow trench at the boundary between the HBT subcollector region and the PIN diode region, with the deep trench isolation region extending into the substrate. Next, the HBT emitter layer is etched away over the PIN diode region, and conductive contacts are formed to the HBT emitter layer, HBT base layer, HBT subcollector region, PIN diode anode region and PIN diode cathode region. Thus, in a single process, HBTs and PIN diodes can be fabricated on the same substrate.

It is the aim of the above technique to use a common i-layer between the devices and to use modified processing techniques to enable the growth of all structures on the same wafer without compromising the performance of any of the devices. Although the process described above contemplates fabricating each circuit on a single substrate (i.e., eliminating the need to use separate substrates and then connecting the substrates in a module), there still remain several limitations. To name one, for example, the PIN diodes i-layer cannot be freely tuned to achieve desired T/R switch speed due to NPN performance requirements.

SUMMARY OF THE INVENTION

In a first aspect of the invention, a structure comprises a single wafer with a first subcollector formed in a first region having a first thickness and a second subcollector formed in a second region having a second thickness, different from the first thickness.

In a second aspect of the invention, a multicircuit structure comprises a far side subcollector formed in the first region having a first thickness and a near side subcollector formed in the second region. The second subcollector region has a thickness less than that of a thickness of the first region. The far side subcollector forms a high breakdown voltage device and the near side subcollector forms a high performance NPN device.

In another aspect of the invention, a method of forming a structure comprises providing a substrate including a first layer and forming a first doped region in the first layer. The method further includes forming a second layer on the first layer and forming a second doped region in the second layer. The second doped region is formed at a different depth than the first doped region.

DESCRIPTION OF EMBODIMENTS OF THE INVENTION

The invention relates to a semiconductor structure and method of manufacturing. In one embodiment, the invention more specifically relates to a structure and method of combining very high breakdown and very high performance NPN (e.g., bipolar) devices on a wafer without compromising the performance of either device, i.e., to optimize both devices. In one embodiment, the method of fabrication uses a dual epitaxial process for on-chip PIN diodes working at millimeter wave range; although other devices such as, for example, high breakdown NPN HBT, varacters, passives, schottky diodes are also contemplated for use with the invention. By implementing the invention, using the same wafer, a high performance NPN can be fabricated with a thin collector and a high breakdown voltage device can be fabricated with a thick film collector. Additionally, in the invention, a second subcollector can be used as a reachthrough of the high breakdown device to contact the subcollector to the surface. The system and method of the invention is fully compatible to the existing BiCMOS technologies.

Figure 1:
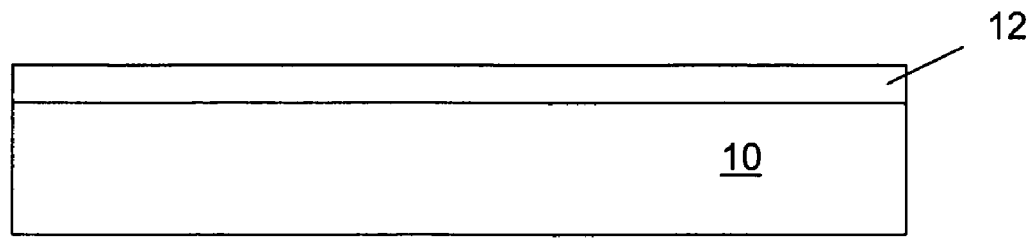
FIGS. 1-13 show process steps for forming the final structure shown in FIG. 13, in accordance with the invention.

Referring to FIG. 1, a starting structure is shown, which includes a pad oxide 12 formed on a substrate 10. In one embodiment, the substrate may be silicon, although other materials may equally be used such as, for example, III-V compound semiconductor substrates or SOI. Although not critical to the understanding of the invention, the substrate 10 may be approximately 700 um thick, with other thickness also contemplated by the invention. The pad oxide 12 may have a thickness of between 50 Å and 150 Å; although, other thickness are also contemplated by the invention. The pad oxide layer 12 may be formed by conventional deposition or growing processes.

Figure 2:
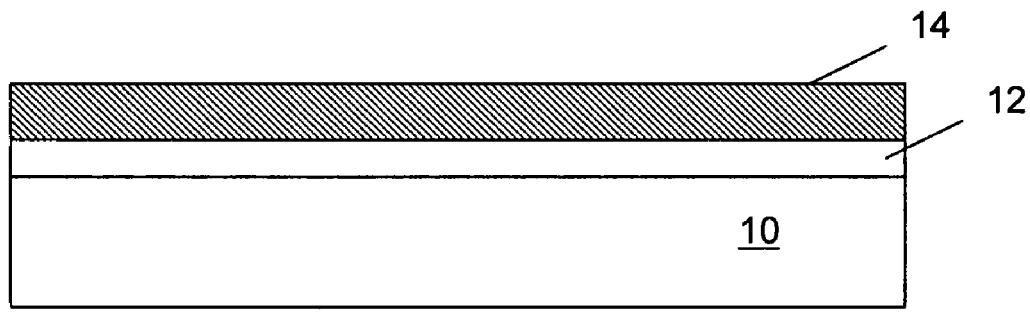
Figure 3:
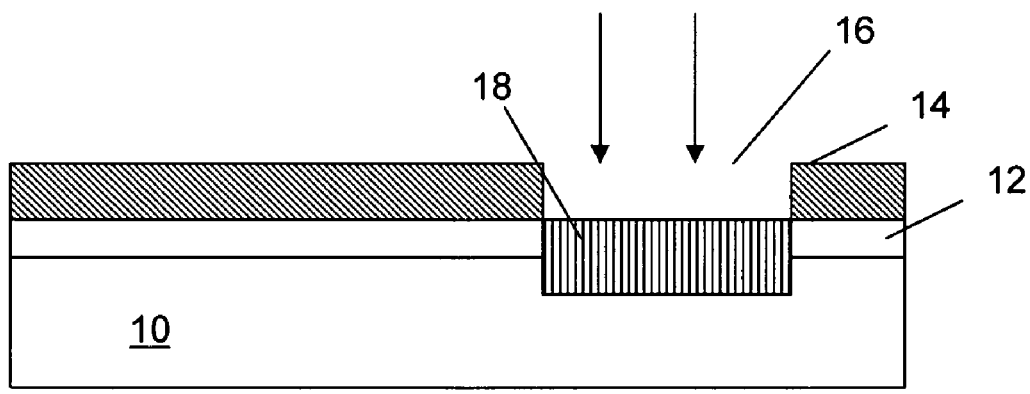

In FIG. 2, a photoresist 14 is formed over the pad oxide 12. In FIG. 3, the photoresist 14 is exposed in order to open a window 16 to the underlying layer(s). The formation of the window 16 is formed in a well-known semiconductor photoresist process such as, using spin on glass techniques. As such, a description of the photoresist process is not necessary for a person of ordinary skill in the art to practice this particular step.

In FIG. 3, after the window 16 is opened in the photoresist 12, the method of fabrication continues by doping, e.g., ion implanting, the exposed underlying layer(s) with well-known dopants. In one illustrative embodiment, the dopant element for a collector may include, for example, arsenic (As) or antimony (Sb). In one implementation, doping occurs at a common energy level and dosage, for example, in the energy range of approximately 20-60 KeV and dose of $1E^{15}$ to $5E^{16}$. The ion implantation process may be used to form a subcollector 18, e.g., deep N+, extending into the underlying layer (s).

Figure 4:
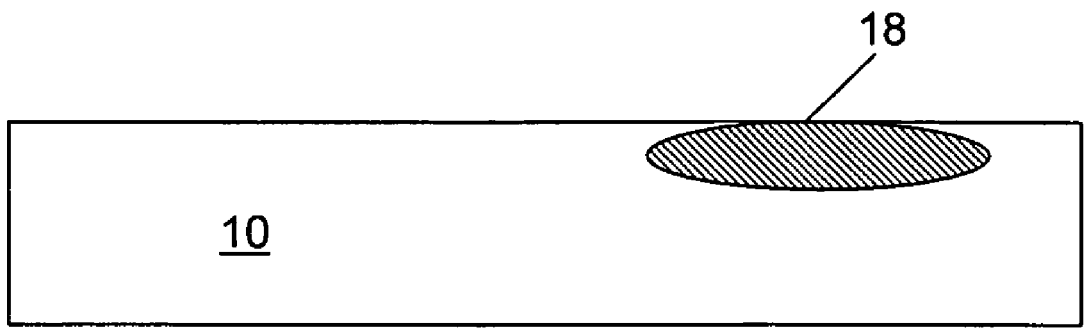

Referring to FIG. 4, the photoresist layer 12 is stripped using conventional processes. In this processing step, the pad oxide 12 may also be stripped, e.g., etched, using conventional processes. In one embodiment, the stripping process removes any implant damage that occurred during the doping process described above.

Figure 5:
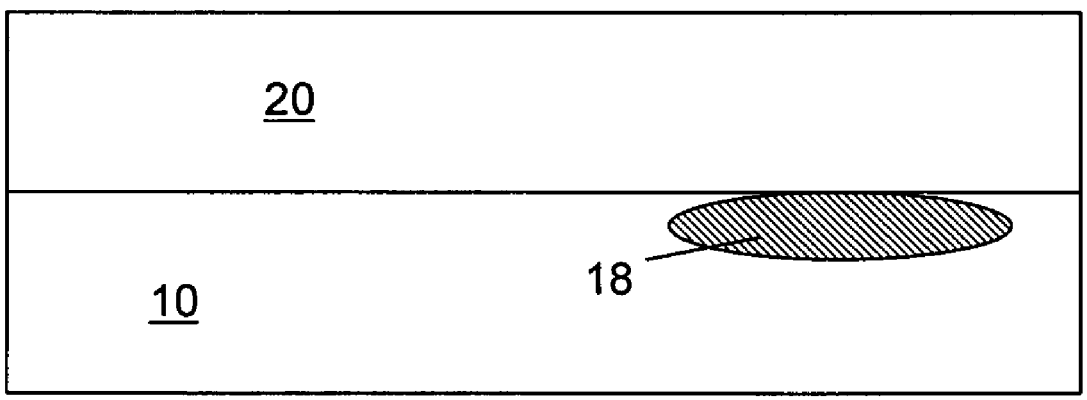
Figure 6:
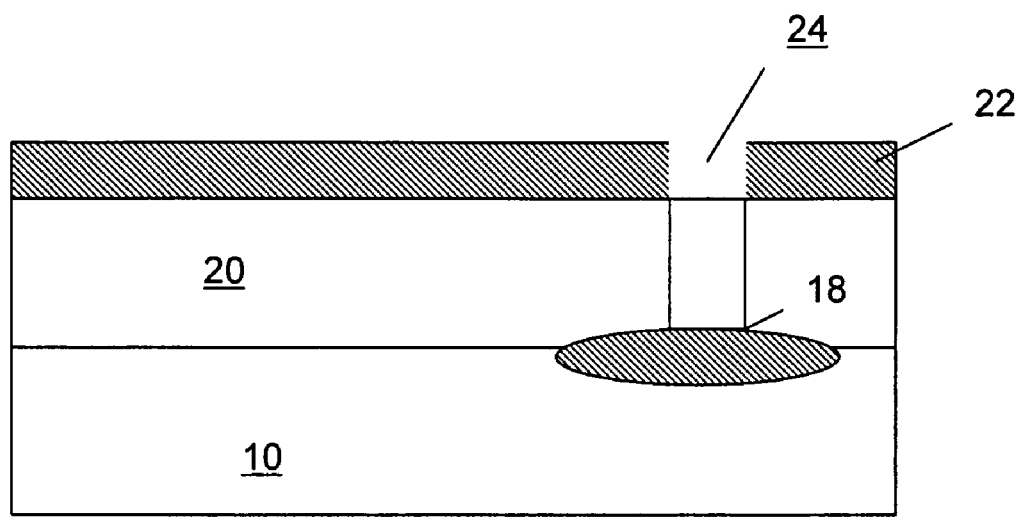

In FIG. 5, an epitaxial (epi) layer 20 is formed over the substrate 10 and, in FIG. 6, a photoresist layer 22 is formed over the epi layer 20. In one embodiment, a pad oxide layer may be formed over the epi layer 20, prior to the formation of the photoresist layer 22. In a conventional fabrication process, the photoresist layer 22 is exposed to light to open window 24.

Figure 7:
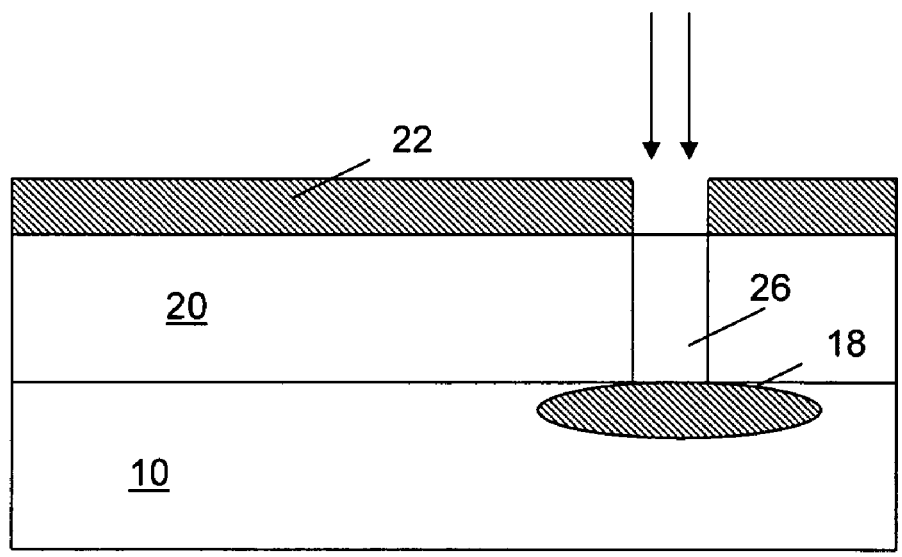

In FIG. 7, an ion implantation process is performed using dopants such as, for example, phosphorous, arsenic or antimony to form the reachthrough as shown in region 26. The reachthrough works as a conducting channel to link the far side subcollector 18 to the surface. The far side subcollector 18 may form a PIN diode cathode or high breakdown NPN HBT subcollector in the final structures, for example. The photoresist layer 22 (and, in embodiments, the pad oxide layer) may then be stripped using conventional processes. Any damage from the ion implanting process may be repaired during this stripping process.

Figure 8:
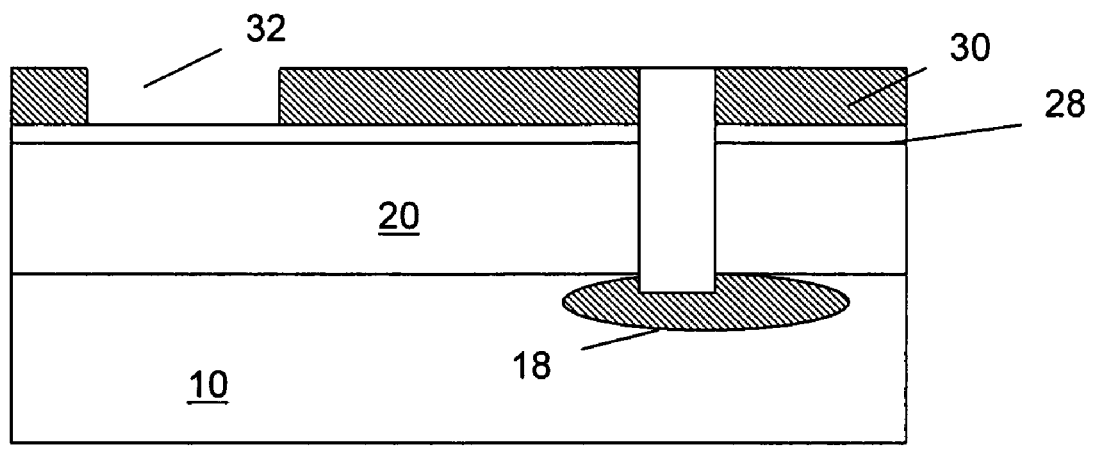

In FIG. 8, a pad oxide layer 28 and another photoresist layer 30 are formed over the epi layer 20, in any conventional manner. For example, as with the previous steps, the pad oxide layer 28 may be thermally grown or deposited. In conventional semiconductor processing steps, a window 32 is opened in the photoresist layer 30, remote from the subcollector 18.

Figure 9:
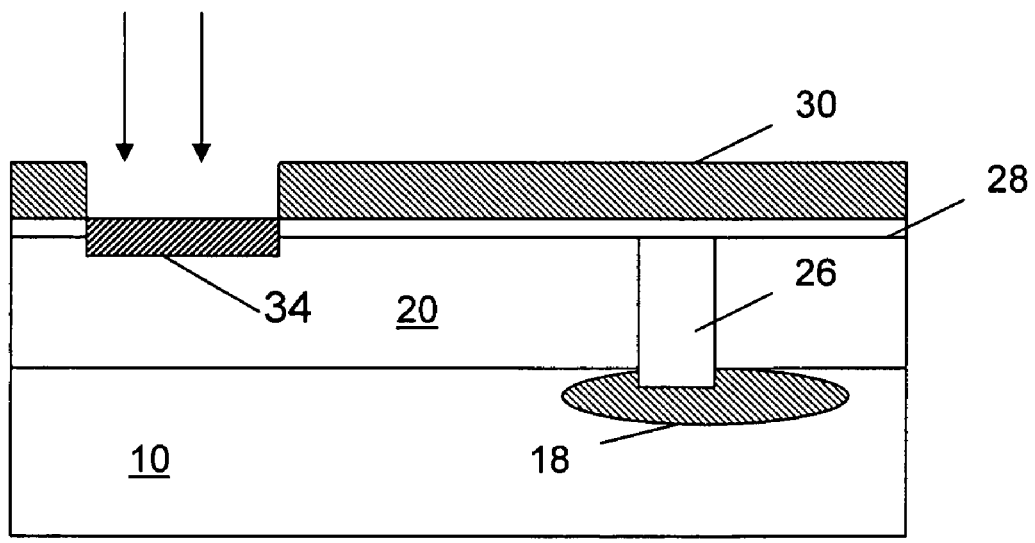

In FIG. 9, a conventional ion implantation process is performed using dopants such as, for example, phosphorous, arsenic or antimony. This dopant process forms a collector 34 within the epi layer 20. The photoresist layer 30 is stripped using a conventional process, with the pad oxide 28 being stripped of thereafter. In one embodiment, this stripping process removes any implant damage that occurred during the doping process described above.

Figure 10:
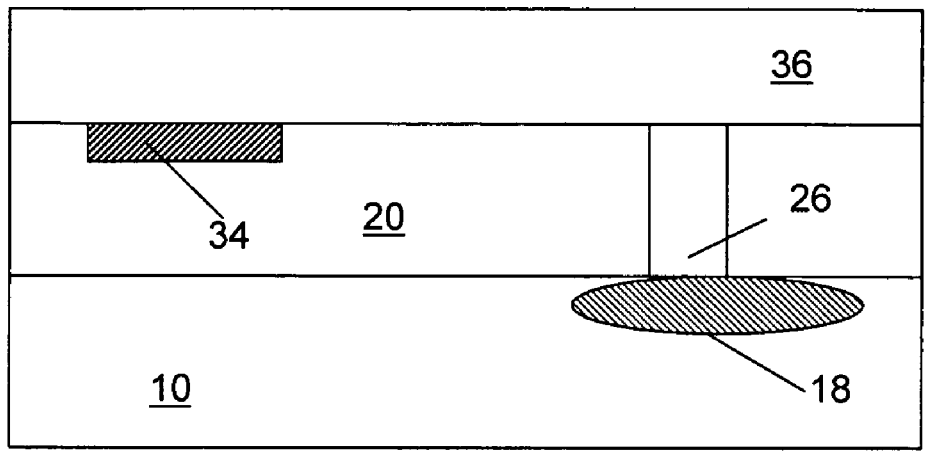

In FIG. 10, a second epi layer 36 is formed over the structure. In particular, the epi layer 36 is formed over the collector 34 and epi layer 20. The second epi layer 36 is preferably of a different thickness than the epi layer 20. Both first and second epitaxial layers can be fabricated to have a wide thickness flexibility to provide tunability of the devices. In an embodiment of the invention, the epi layer 36 is approximately 0.4 um and more preferably may range from 0.3 um to 1 um, which is less than the thickness of the epi layer 20, which normally may range from 1-3 um. In any scenario, the second epi layer 36 can be formed at any thickness to tune the device, thus providing advantages over known fabrication methods.

By fabricating a second epi layer 36, which can be of a desired thickness, a thin film collector for high performance NPN devices and a thick film collector for high breakdown voltage devices can be fabricated on a single wafer. By having a thin film collector and a thick film collector, performance of both the high performance NPN devices and the high breakdown voltage devices can be optimized.

Figure 11:
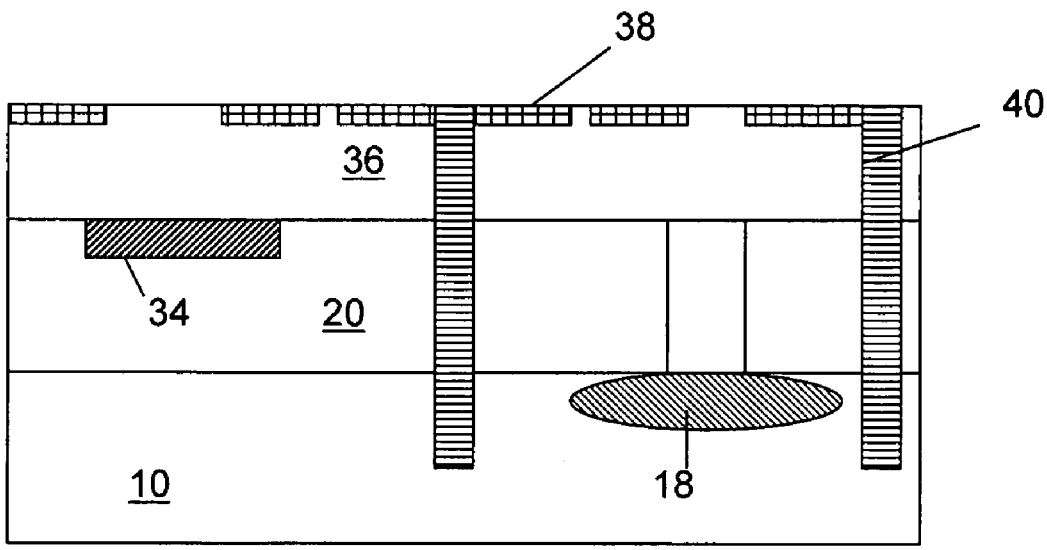

In FIG. 11, shallow trench isolation structures 38 and deep trench isolation structures 40 are formed in conventional processes. The shallow trench isolation structures 38 and deep trench isolation structures 40 are formed for device isolation purposes. Alternatively, isolation structures may comprise local oxidation of silicon ("LOCOS") structures.

Figure 12:
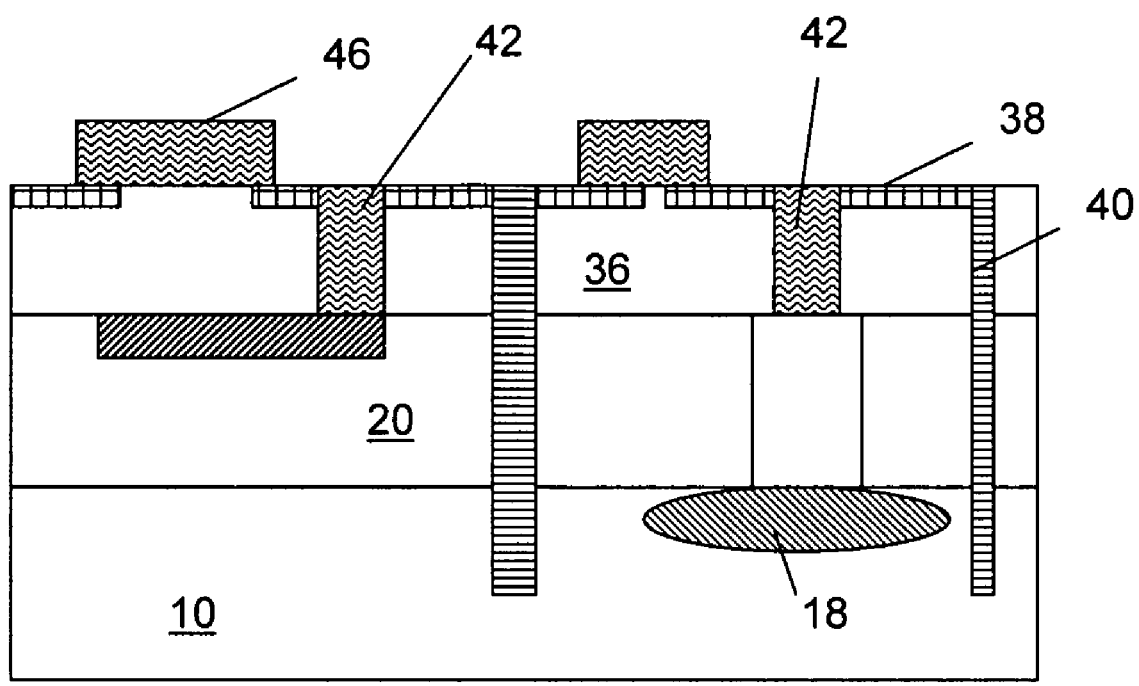

In FIG. 12, a second reachthrough 42 is formed in the second epi layer 36. The second reachthrough 42 works as a conducting channel to link the collector or the first reachthrough to the surface for contact. The reachthrough is formed by ion implantation with species such as phosphorous, arsenic and antimony. The reachthrough implant energy ranges from 50-100 KeV and dose ranges from 1e15 to 5e16, respectively. The second reachthrough for linking the first reachthrough should be aligned properly to eliminate any misalignment caused high conducting resistance.

Still referring to FIG. 12, a P+ film 46 is grown selectively over the epi layer 36 in a conventional epitaxial manner, such as LTE, LPCVD, CVD etc., to form the high performance NPN HBT base and the PIN diode anode. Other processes details are not show here but should be known to those of skill in the art. For example, an oxide layer may be used to protect the epi layer 36 during CVD processing. A nitride film may also be formed after the P+ film deposition to protect the HBT, PIN etc. being attacked by FET processing. The nitride film may be opened when contact is made.

The remaining process steps required to complete the integrated circuit involve such steps as forming a high performance NPN emitter layer, forming passive components, forming interconnect metallization, etc. which are performed as is well known in the art. For example, in FIG. 13, an interlevel dielectric layer 48, preferably comprising BPSG, is deposited over the P+ film 46 with a CVD process. In embodiments, the interlevel dielectric layer 48 is deposited to electrically insulate the device from a subsequently deposited, overlying metal layer. Tungsten contacts 50 are formed in the interlevel dielectric layer 48, in a conventional manner, connecting to the P+ films 46 and the reachthrough 42. The tungsten contacts 50 contacting to the reachthrough form an N+ terminal of the device and the tungsten contacts 50 contacting to the P+ film forms the P+ terminal of the devices.

Figure 13:
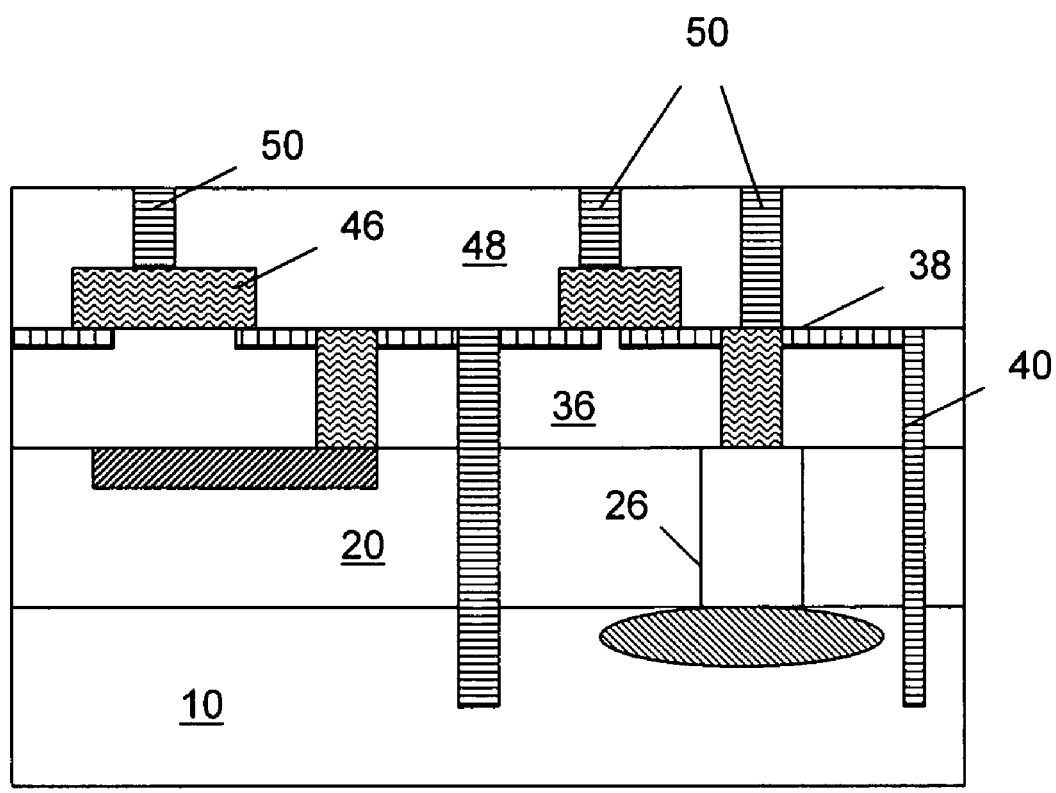

In the embodiment of FIG. 13, the far side subcollector 18 portion of the device may used to form a high breakdown voltage device. The high breakdown voltage device, in embodiments, may include NPN HBT transistor, PIN diodes, varactors, passives, schottky diodes and the like. The collector 34 side of the structure, on the other hand, may be used to form a high performance NPN device formed on a thinner collector layer than the high breakdown voltage device, thus optimizing the performance of both devices.

Figure 14:
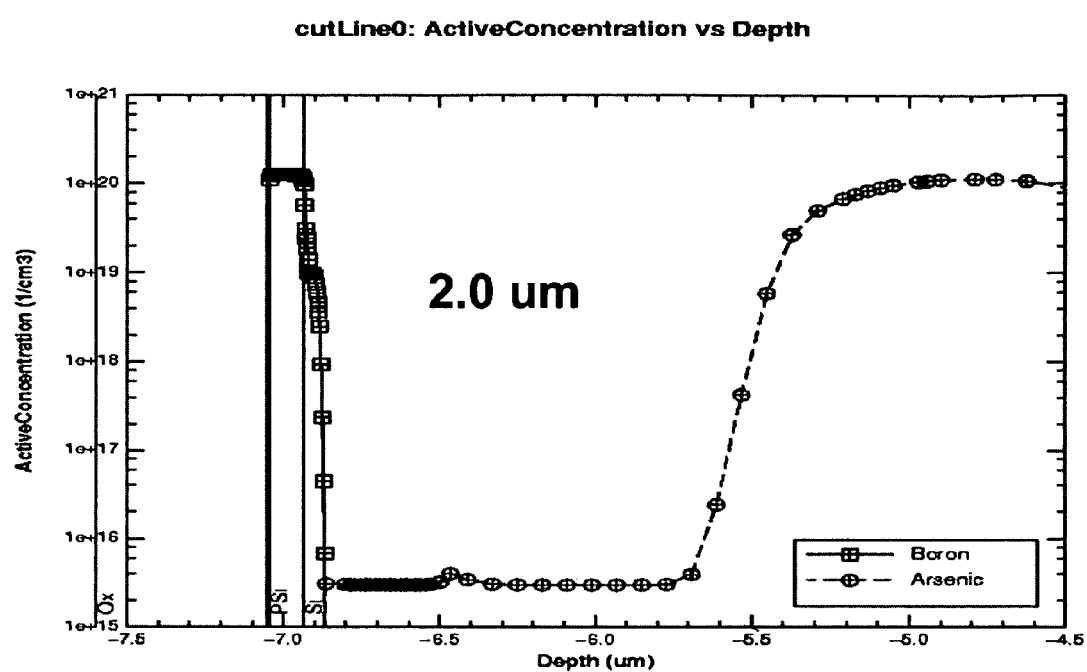
FIG. 14 shows a graph comparing concentration to depth, implementing an illustrative embodiment of the invention.

Table 1 shows the characteristics of the PIN Diode RF response in accordance with an embodiment of the invention. The characteristics include, for example, insertion loss (db) in forward mode and isolation (db) characteristics in reverse mode. FIG. 14 is a graphical representation of the doping profiles of a PIN diode shown in Table 1. The characteristics shown in Table 1 include six GHz ranges, from 2 GHz to 100 GHz, with three examples.

TABLE 1

| 1st epi thickness f (GHz) | 0.8 um insertion loss (dB) | isolation (dB) | 1.5 um insertion loss (dB) | isolation (dB) | 2 um insertion loss (dB) | isolation (dB) |
|---|---|---|---|---|---|---|
| 2 | −0.95619 | −41.655 | −1.8966 | −46.062 | −2.0015 | −47.39 |
| 10 | −0.9178 | −27.369 | −1.8354 | −31.502 | −1.9403 | −33.357 |
| 30 | −0.90873 | −17.318 | −1.8049 | −21.279 | −1.9479 | −24.743 |
| 60 | −0.84959 | −11.172 | −1.6497 | −15.282 | −1.8269 | −19.863 |
| 80 | −0.67746 | −8.8834 | −1.3988 | −12.876 | −1.6191 | −17.252 |
| 100 | −0.65171 | −7.2844 | −1.301 | −11.384 | −1.5227 | −16.151 |

Figure 15:
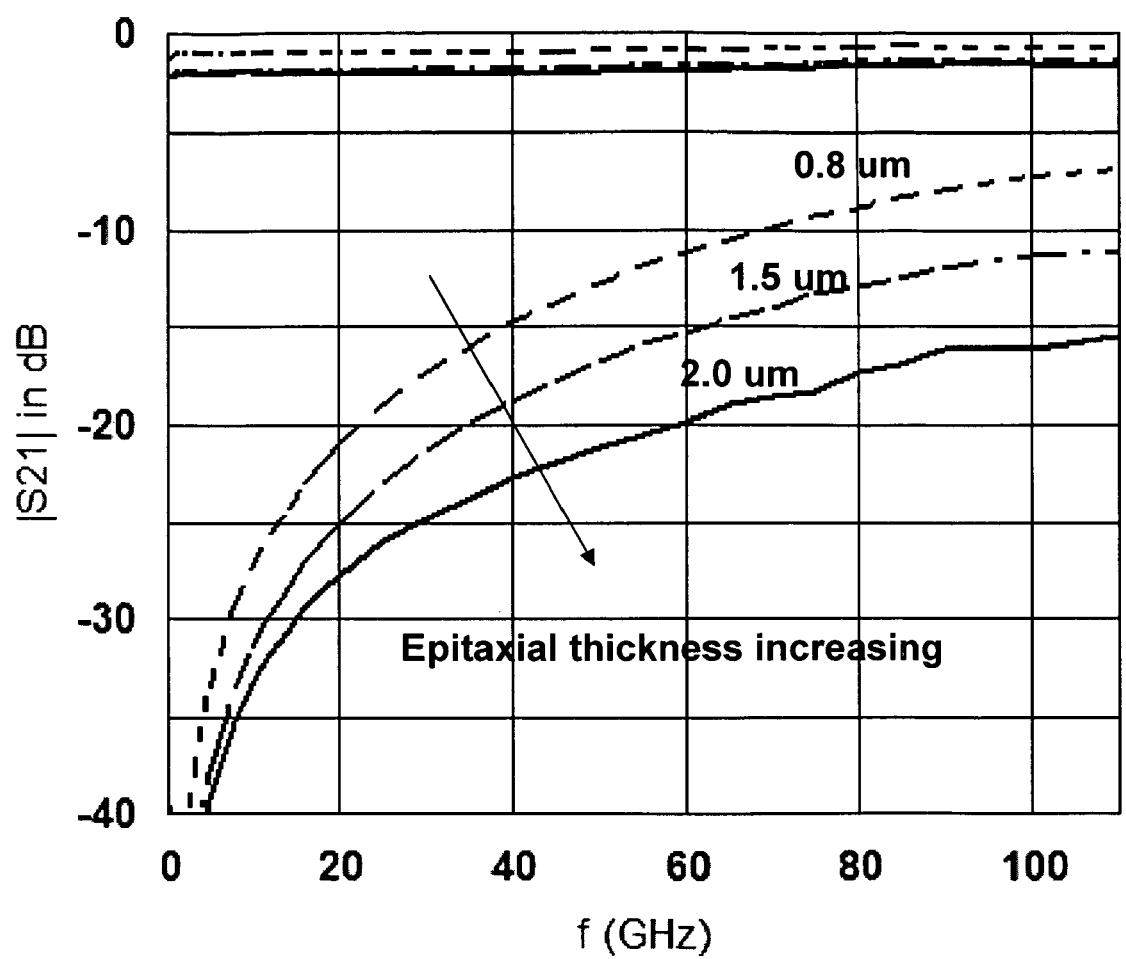
FIG. 15 is a graphical representation of the PIN diode RF characteristics shown in Table 1, in accordance with the invention.

FIG. 15 is a graphical representation of the results shown in Table 1, in accordance with the invention.

While the invention has been described with reference to exemplary embodiments, it is understood that the words, which have been used herein, are words of description and illustration, rather than words of limitation. Changes may be made, within the purview of the appended claims, without departing from the scope and spirit of the present invention in its aspects. Thus, although the invention has been described herein with reference to particular materials and embodiments, the invention is not intended to be limited to the particulars disclosed herein; rather, the invention extends to all functionally equivalent structures, methods and uses, such as are within the scope of the appended claims.

What is claimed is:

1. A structure, comprising:
a single wafer with a first subcollector formed in a substrate and a second subcollector formed in a first epitaxial layer on the substrate, wherein the first subcollector is formed at a different depth than the second subcollector;
a second epitaxial layer on the first epitaxial layer;
a first reachthrough structure in the first epitaxial layer, contacting the first subcollector, and extending from the first subcollector to an upper surface of the first epitaxial layer; and
a second reachthrough structure in the second epitaxial layer wherein the second reachthrough structure contacts the first reachthrough structure and extends from an upper surface of the second epitaxial layer to a level of an interface between the first epitaxial layer and the second epitaxial layer.

2. The structure of claim 1, wherein the first subcollector forms a high breakdown voltage device.

3. The structure of claim 2, wherein the second subcollector forms a high performance NPN device.

4. The structure of claim 2, wherein the high breakdown voltage device is a PIN diode.

5. The structure of claim 2, wherein the high breakdown voltage device is one of a NPN HBT transistor, varactor, passive, and schottky diode.

6. The structure of claim 1, wherein the thickness of the first epitaxial layer is a range of approximately from 1 µm to 3 µm, and the thickness of the second epitaxial layer is approximately 0.3 µm to 1 µm.

7. The structure of claim 1, wherein the first reachthrough structure is arranged over the first subcollector and works as a conducting channel to link the first subcollector to the surface of the first epitaxial layer.

8. The structure of claim 1, further comprising a P+ film formed on the second epitaxial layer.

9. The structure of claim 8, further comprising isolation regions formed in the second epitaxial layer.

10. The structure of claim 9, wherein selective ones of the isolation regions comprise deep trench isolations that extend into the underlying substrate through the first epitaxial layer and the second epitaxial layer.

11. The structure of claim 8, further comprising a dielectric layer formed above the second epitaxial layer and metal contacts extending from the P+ film to a surface.

12. The structure of claim 11, wherein other metal contacts extend to the second reachthrough structure.

13. The structure of claim 12, wherein the other metal contacts form an N+ terminal.

14. The structure of claim 11, wherein the metal contacts contacting the P+ film form a P+ contact.

15. The structure of claim 1, further comprising:
a third reachthrough structure formed in the second epitaxial layer and contacting the second subcollector, wherein the third reachthrough structure extends from the upper surface of the second epitaxial layer to a level of an interface between the first epitaxial layer and the second epitaxial layer;
a deep trench isolation structure between the first subcollector and the second subcollector;
a first shallow trench isolation structure in the second epitaxial layer and between the second reachthrough structure and the deep trench isolation structure; and
a second shallow trench isolation structure in the second epitaxial layer and between the third reachthrough structure and the deep trench isolation structure.

16. A multicircuit structure, comprising:
a far side subcollector formed at an upper surface of a substrate;
a first epitaxial layer on the substrate;
a near side subcollector formed in the first epitaxial layer;
a second epitaxial layer on the first epitaxial layer, wherein the second epitaxial layer has a vertical thickness less than that of the first epitaxial layer;
a first reachthrough structure contacting the far side subcollector and extending from the far side subcollector to a surface of the first epitaxial layer; and
a second reachthrough structure extending from an upper surface of the second epitaxial layer to a level of an interface between the first epitaxial layer and the second epitaxial layer, wherein the far side subcollector forms a high breakdown voltage device and the near side subcollector forms a high performance NPN device;

the second reachthrough structure contacts the first reachthrough structure; and the far side subcollector is formed at a different depth than the near side subcollector.

17. The multicircuit structure of claim 16, wherein the high breakdown voltage device is a high breakdown NPN HBT, PIN diode, a varactor, passive, or schottky diode.

18. The multicircuit structure of claim 16, wherein the thickness of the first epitaxial layer is a range of approximately from 1 μm to 3 μm.

19. The multicircuit structure of claim 16, wherein the thickness of the second epitaxial layer is approximately from 0.3-1 μm.

20. The multicircuit structure of claim 16, wherein the first reachthrough structure is arranged over the far side subcollector and works as a conducting channel to link the far side subcollector to the surface of the first epitaxial layer.

21. The multicircuit structure of claim 16, further comprising P+ film formed on the second epitaxial layer.

22. The multicircuit structure of claim 21, further comprising isolation regions formed in the second first epitaxial layer, wherein selective ones of the isolation regions comprise deep trench isolations that extend into the underlying substrate through the first epitaxial layer and the second epitaxial layer.

23. The multicircuit structure of claim 22, wherein the metal contacts contacting the P+ film form a P+ anode.

24. The multicircuit structure of claim 22, further comprising a dielectric layer formed above the second epitaxial layer and metal contacts extending from the P+ film to a surface.

25. The multicircuit structure of claim 24, wherein other metal contacts extending to the reachthrough contacting the far side subcollector form an N+ cathode.

* * * * *